United States Patent
Park et al.

(10) Patent No.: US 12,369,289 B2
(45) Date of Patent: Jul. 22, 2025

(54) COMPONENT GROUNDING SYSTEM

(71) Applicant: HYOSUNG HEAVY INDUSTRIES CORPORATION, Seoul (KR)

(72) Inventors: Yong Hee Park, Anyang-si (KR); Hong Bean Park, Hwaseong-si (KR); Hong Ju Jung, Seoul (KR)

(73) Assignee: HYOSUNG HEAVY INDUSTRIES CORPORATION, Seoul (KR)

( * ) Notice: Subject to any disclaimer, the term of this patent is extended or adjusted under 35 U.S.C. 154(b) by 283 days.

(21) Appl. No.: 18/015,712

(22) PCT Filed: Aug. 12, 2021

(86) PCT No.: PCT/KR2021/010696
§ 371 (c)(1),
(2) Date: Jan. 11, 2023

(87) PCT Pub. No.: WO2022/035241
PCT Pub. Date: Feb. 17, 2022

(65) Prior Publication Data
US 2023/0292477 A1    Sep. 14, 2023

(30) Foreign Application Priority Data
Aug. 13, 2020  (KR) .................. 10-2020-0101708

(51) Int. Cl.
*H05K 9/00* (2006.01)
*H05K 7/20* (2006.01)

(52) U.S. Cl.
CPC ......... *H05K 9/0064* (2013.01); *H05K 7/2039* (2013.01); *H05K 9/0007* (2013.01)

(58) Field of Classification Search
CPC .............................. H05K 5/056; H05K 9/0064
See application file for complete search history.

(56) References Cited

U.S. PATENT DOCUMENTS

| | | | |
|---|---|---|---|
| 8,422,230 B2 * | 4/2013 | Aiba | H05K 7/20 363/137 |
| 11,049,655 B2 * | 6/2021 | Nishimura | H01G 11/10 |
| 2020/0245480 A1 * | 7/2020 | Mauger | H05K 5/0073 |
| 2021/0378108 A1 * | 12/2021 | Park | H05K 5/0056 |

FOREIGN PATENT DOCUMENTS

| | | |
|---|---|---|
| JP | 2013-053633 A | 3/2013 |
| JP | 2014-082738 A | 5/2014 |
| JP | 2014-096930 A | 5/2014 |
| JP | 2015-122241 A | 7/2015 |
| JP | 6608555 B1 | 11/2019 |
| KR | 10-1763298 B1 | 8/2017 |

* cited by examiner

*Primary Examiner* — Hung V Ngo
(74) *Attorney, Agent, or Firm* — Harvest IP Law, LLP

(57) ABSTRACT

A component grounding system according to one embodiment includes a case for accommodating a plurality of components, a direct current (DC) capacitor disposed on one side of the case and electrically connected to the case, and a bus bar, disposed between the case and the DC capacitor, for connecting the case and the DC capacitor, the bus bar representing an electrode, wherein each of the plurality of components may be connected to the bus bar.

5 Claims, 5 Drawing Sheets

Test voltage : 2260V / 2400V / 2640V / 3000V

|  | First cable | First insulator | Heat dissipation plate |
|---|---|---|---|
| Case 1 | X | X | X |
| Case 2 | O | O | O |

O: Connected to ground
X: Not connected to ground

COMPONENT GROUNDING SYSTEM

CROSS-REFERENCE TO RELATED APPLICATIONS

This application claims the benefit under 35 U.S.C. section 371, of PCT International Application No. PCT/KR2021/010696, filed on Aug. 12, 2021, which claims foreign priority to Korean Patent Application No. 10-2020-0101708, filed on Aug. 13, 2020, in the Korean Intellectual Property Office, both of which are hereby incorporated by reference in their entireties.

TECHNICAL FIELD

The following description relates to a component grounding system.

BACKGROUND ART

Various electricity boards (e.g., a power supply, a controller, a driver, a printed circuit board (PCB), etc.) are mounted inside a sub-module, and each board is connected to a reference potential point (a negative (−) electrode of a direct current (DC) capacitor) using a cable to set a reference potential.

Here, to effectively prevent interference between a plurality of cables and form a connection, a sub-module case with the same potential as that of the reference potential point (the negative (−) electrode of the DC capacitor) is connected. However, since in such a scheme, it is impossible to minimize the stray capacitance of a case and a heat dissipation plate, a high noise voltage may be generated at the reference potential. This is a factor that generates a high noise voltage at the reference potential.

A communicatory repeater box for mounting an electric pole is disclosed in Korean Patent Publication No. 10-1763298.

DISCLOSURE OF THE INVENTION

Technical Goals

An aspect according to an embodiment is to provide a component grounding system that may reduce a stray capacitance.

An aspect according to an embodiment is to provide a component grounding system that may effectively reduce a noise voltage that may be generated at a reference potential.

Technical Solutions

A component grounding system according to an embodiment includes a case configured to accommodate a plurality of components, a direct current (DC) capacitor disposed on one side of the case and electrically connected to the case, and a bus bar disposed between the case and the DC capacitor to connect the case and the DC capacitor, the bus bar representing a negative (−) electrode. Each of the plurality of components may be connected to the bus bar.

Here, each of a plurality of first cables configured to connect each of the components to the bus bar may be directly connected to the bus bar.

Alternatively, the component grounding system may further include a heat dissipation plate disposed inside the case, and a first insulator disposed on an inner side surface of the case. A first cable connected to each of the plurality of components may be directly connected to the first insulator, the heat dissipation plate may be directly connected to the bus bar by a second cable, and the second cable and the first insulator may be connected by a third cable.

The component grounding system may further include a fourth cable disposed inside the case and used at a high voltage, and a second insulator configured to separate the fourth cable from the case to prevent the fourth cable from contacting an inner surface of the case.

Here, the second insulator may be formed with a shape of "L".

In addition, the second insulator may include a plurality of grooves formed to be spaced apart from each other at regular intervals, and the fourth cable may be extended by passing through a portion of the plurality of grooves.

Furthermore, the component grounding system may further include a connection terminal disposed between the case and the DC capacitor to connect the case and the DC capacitor, the connection terminal representing a positive (+) electrode, and a discharge resistance disposed below the heat dissipation plate.

Effects

According to an embodiment, a component grounding system may reduce a stray capacitance.

According to an embodiment, a component grounding system may effectively reduce a noise voltage that may be generated at a reference potential.

BEST MODE FOR CARRYING OUT THE INVENTION

Figure 1:
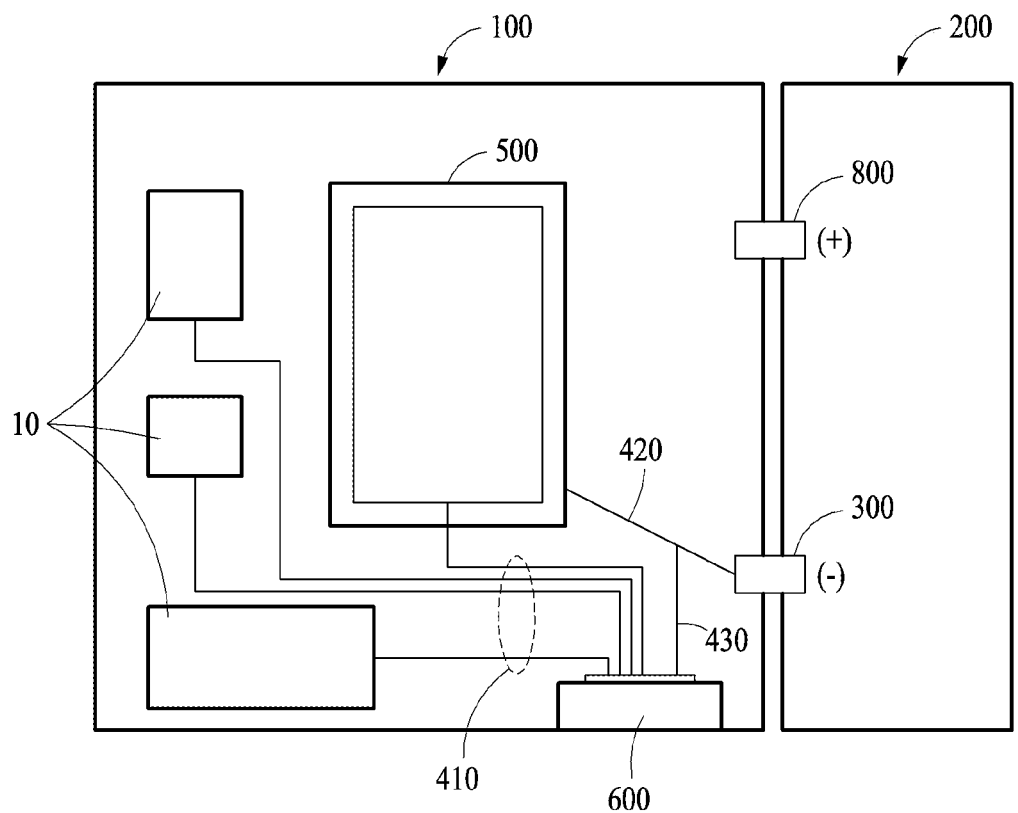
FIG. 1 is a diagram illustrating an example of a component grounding system according to an embodiment.

Hereinafter, embodiments will be described in detail with reference to the accompanying drawings. However, various alterations and modifications may be made to the embodiments, and the embodiments are not meant to be limited by the descriptions of the present disclosure. The embodiments should be understood to include all changes, equivalents, and replacements within the idea and the technical scope of the disclosure.

The terminology used herein is for the purpose of describing particular embodiments only and is not intended to be limiting. The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which the embodiments belong. Terms defined in dictionaries generally used should be construed to have meanings matching with contextual meanings in the related art and are not to be construed as an ideal or excessively formal meaning unless otherwise defined herein.

When describing the embodiments with reference to the accompanying drawings, like reference numerals refer to like components and a repeated description related thereto will be omitted. In the description of embodiments, detailed description of well-known related structures or functions will be omitted when it is deemed that such description will cause ambiguous interpretation of the present disclosure.

In addition, when describing components according to the embodiments, terms such as first, second, A, B, (a), (b) or the like may be used herein. These terms are used only for the purpose of discriminating one component from another component, and the nature, the sequences, or the orders of the components are not limited by the terms. It should be noted that if one component is described as being "connected," "coupled" or "joined" to another component, the former may be directly "connected," "coupled," and "joined" to the latter or "connected", "coupled", and "joined" to the latter via another component.

A component, which has the same common function as a component included in any one embodiment, will be described by using the same name in other embodiments. Unless disclosed to the contrary, the description provided in any one embodiment may also be applied to other embodiments, and the specific description of the repeated configuration will be omitted.

Figures 2, 3:
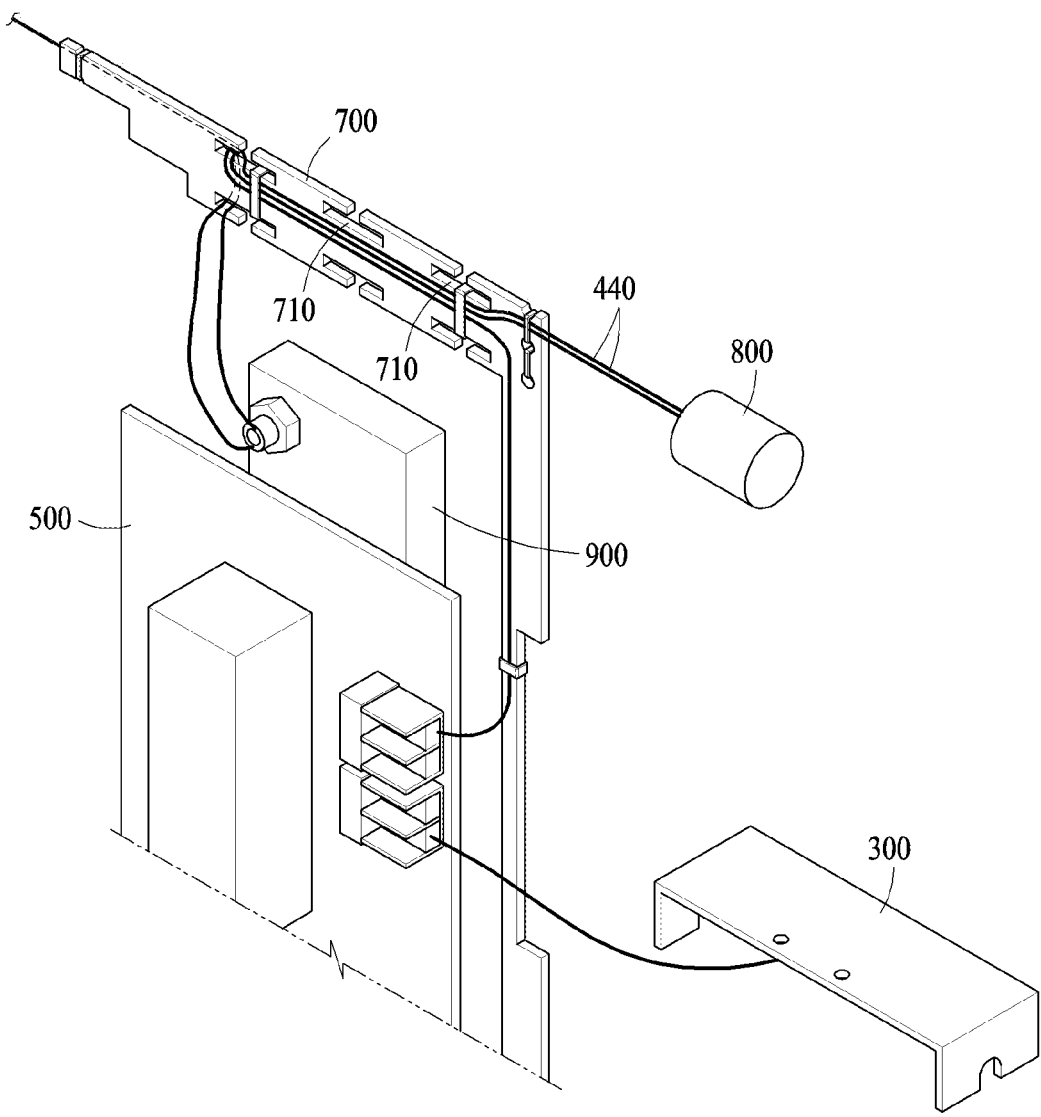
FIG. 2 illustrates, in detail, an insulator of a component grounding system according to an embodiment.
FIGS. 3 to 5 illustrate experimental data for identifying a performance of a component grounding system according to an embodiment.

Referring to FIGS. 1 and 2, a component grounding system according to an embodiment may include a case 100 configured to accommodate a plurality of components 10, a direct current (DC) capacitor 200 disposed on one side of the case and electrically connected to the case, and a bus bar 300 that is disposed between the case and the DC capacitor to connect the case and the DC capacitor and that represents a negative (−) electrode.

Here, the plurality of components may correspond to, for example, a silicon controlled rectifier (SCR) driver, a backplane (BP) driver, a shared memory (SM) controller, and the like. In addition, the plurality of components may include, for example, an insulated gate bipolar transistor (IGBT) heat dissipation plate. Each of the plurality of components may be connected to the bus bar 300.

Specifically, the component grounding system may further include a heat dissipation plate 500 disposed inside the case, and a first insulator 600 disposed on an inner side surface of the case. A first cable 410 connected to each of the plurality of components may be directly connected to the first insulator. The heat dissipation plate 500 may be directly connected to the bus bar by a second cable 420. The second cable and the first insulator may be connected by a third cable 430.

As described above, the first cable 410 connected to the plurality of components including the heat dissipation plate 500 may be connected to the first insulator 600, instead of directly connecting cables connected to various components to the case 100. Subsequently, the heat dissipation plate 500 may be connected to the bus bar separately by the second cable 420, and the first insulator 600 and the second cable 420 may be connected by the third cable 430. Accordingly, reference potential cables of the plurality of components may be bundled together in a single point, and a one-point grounding may be achieved by the bus bar 300 representing the negative (−) electrode in a heat dissipation plate having a highest stray capacitance. Thus, the stray capacitance may be reduced, and a noise voltage generated at a reference potential may be reduced by 50% or greater, in comparison to a related art.

In addition, the component grounding system may further include a second insulator configured to insulate a high-voltage cable 440 or a signal cable, in addition to the first cable 410 through the third cable 430 that are ground cables, from the case.

In other words, the component grounding system may further include the fourth cable 440 disposed inside the case and used at a high voltage, and a second insulator 700 configured to separate the fourth cable from the case to prevent the fourth cable from contacting an inner surface of the case. Here, the second insulator may be formed with a shape of "L".

Specifically, the second insulator 700 may include a plurality of grooves 710 formed to be spaced apart from each other at regular intervals, and the fourth cable 440 may be extended in the case by contacting the second insulator 700 in a manner of passing through a portion of the plurality of grooves 710. In other words, based on the above structure, the fourth cable 440 may not contact the inner surface of the case. In addition, based on the above structure, a high-voltage cable and a signal cable, in addition to a ground cable, may also be separated from the case using an insulator, and thus an effect of reducing a stray capacitance may be derived.

In addition, the component grounding system may further include a connection terminal 800 that is disposed between the case and the DC capacitor to connect the case and the DC capacitor and that represents a positive (+) electrode, and a discharge resistance 900 disposed below the heat dissipation plate.

Figure 4:
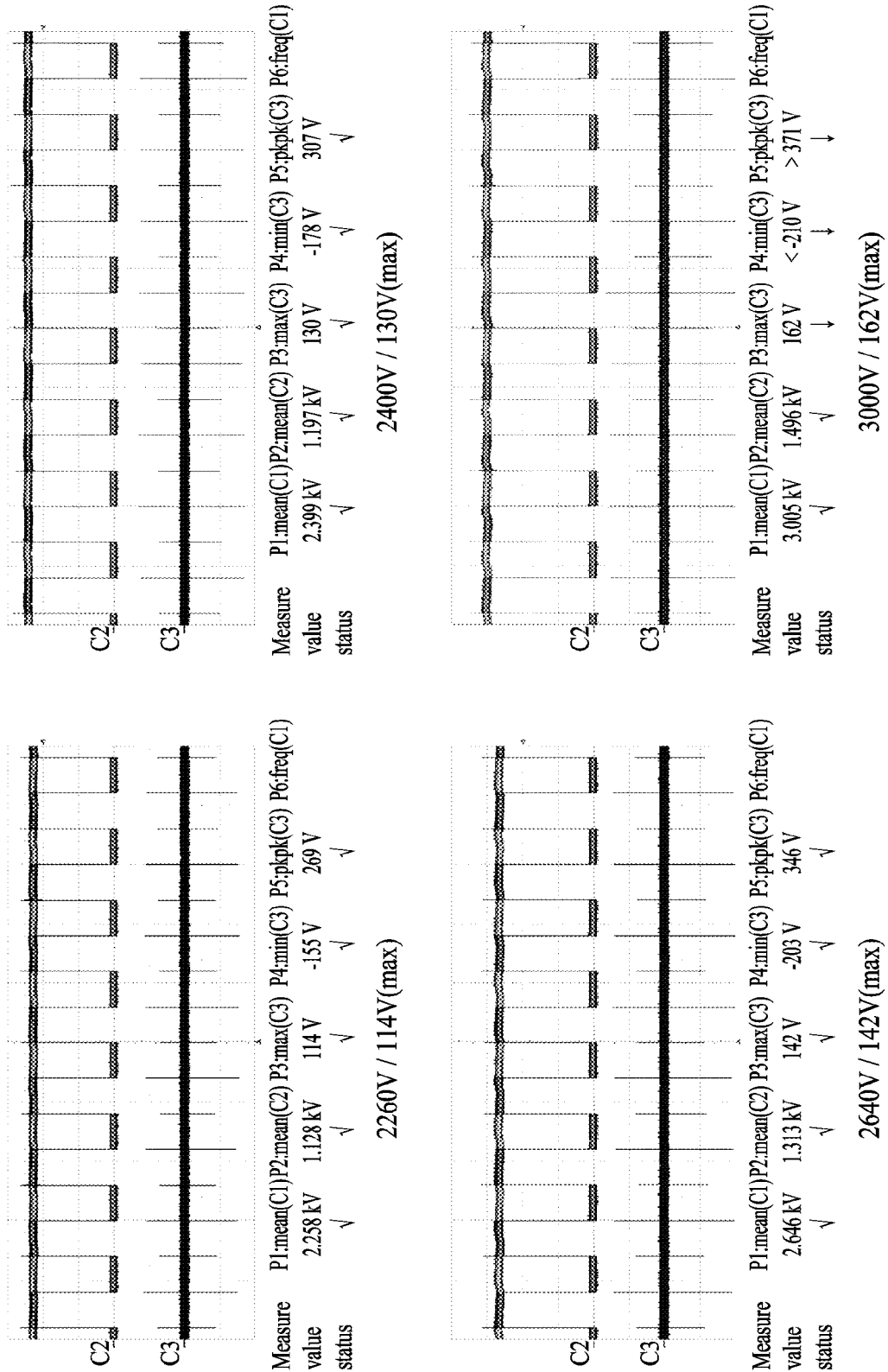
Figure 5:
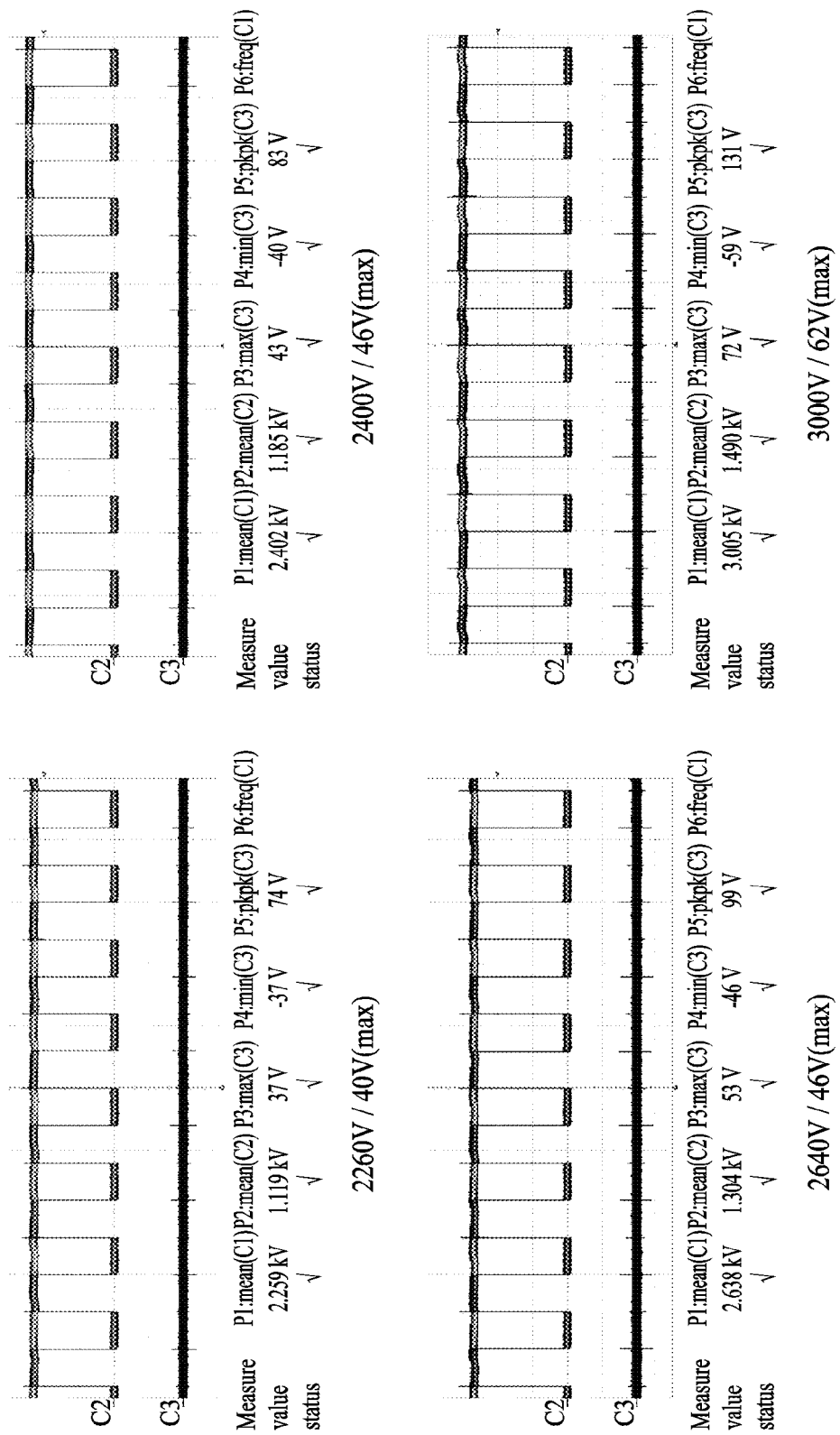

An effect of reducing a noise voltage based on a structure of a component grounding system according to the present disclosure may be significantly increased, which will be described below with reference to FIGS. 3 to 5.

Referring to FIG. 3, experiments were conducted for four test voltages, for example, 2260 volts (V), 2400 V, 2640 V, and 3000V, by setting whether a first cable, a first insulator, and a heat dissipation plate are connected to the ground differently for each case.

As a result, when all the first cable, the first insulator, and the heat dissipation plate are set to be connected to the ground, the most excellent experimental results are obtained.

Specifically, it is confirmed that, in case 1 in which all the first cable, the first insulator, and the heat dissipation plate are not connected to the ground, noise voltages of 114 V to 162 V are generated for the four voltages, for example, 2260 V, 2400 V, 2640 V, and 3000 V.

In another example, it is confirmed that, in case 2 in which all the first cable, the first insulator, and the heat dissipation plate are connected to the ground, noise voltages of 40 V to 62 V are generated for the four voltages, for example, 2260 V, 2400 V, 2640 V, and 3000 V. In this case, the lowest noise voltage is generated, the most effective result is obtained, and the structure of the component grounding system according to the present disclosure is reflected in the corresponding case.

In other words, it may be confirmed that a noise voltage may be reduced based on a structure in which the first cable, the first insulator, and the heat dissipation plate are connected to the ground, as in the present disclosure.

Figure 6:
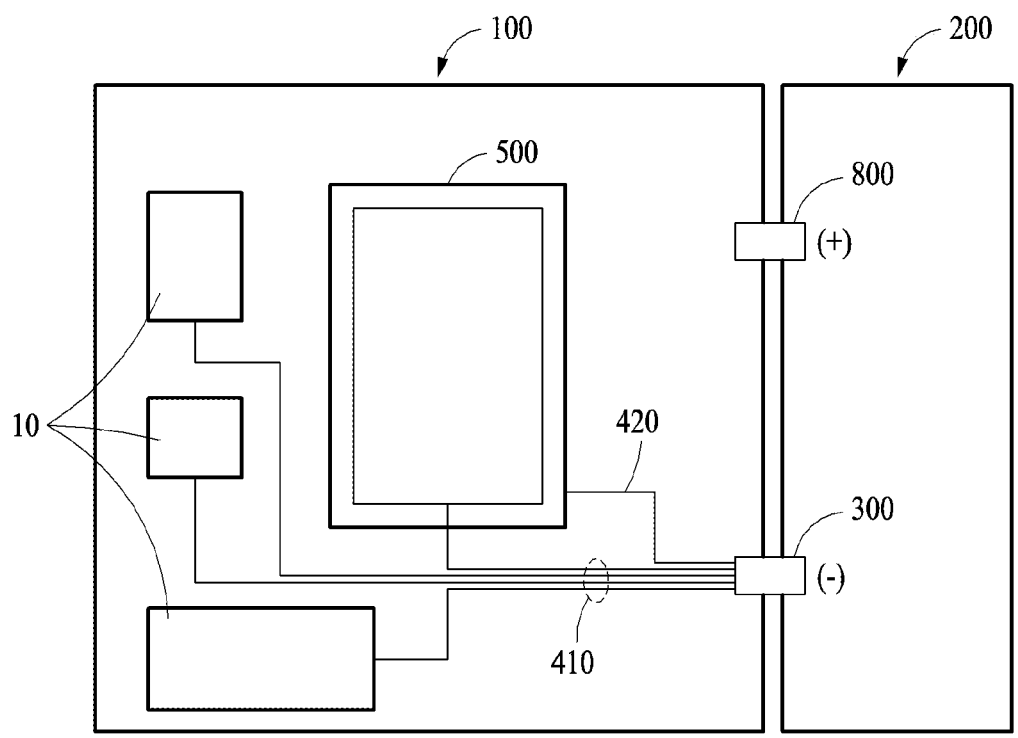
FIG. 6 is a diagram illustrating another example of a component grounding system according to an embodiment.

In addition, in an example of FIG. 6, a plurality of components of a component grounding system may not be connected to a first insulator. Also, the plurality of components may be individually directly connected to a bus bar by separate first cables.

The component grounding system including the above-described configuration according to an embodiment may reduce a stray capacitance, to effectively reduce a noise voltage that may be generated at a reference potential.

As described above, although the embodiments have been described with reference to the limited drawings, one of ordinary skill in the art may apply various technical modifications and variations based thereon. For example, suitable results may be achieved if the described techniques are performed in a different order, and/or if components in a described system, architecture, device, or circuit are combined in a different manner, and/or replaced or supplemented by other components or their equivalents.

Therefore, other implementations, other embodiments, and equivalents to the claims are also within the scope of the following claims.

The invention claimed is:

1. A component grounding system comprising:
   a case configured to accommodate a plurality of components;
   a direct current (DC) capacitor disposed on one side of the case and electrically connected to the case; and
   a bus bar disposed between the case and the DC capacitor to connect the case and the DC capacitor, the bus bar representing a negative (−) electrode;
   a heat dissipation plate disposed inside the case; and
   a first insulator disposed on an inner side surface of the case,
   wherein each of the plurality of components is connected to the bus bar,
   wherein a first cable connected to each of the plurality of components is directly connected to the first insulator,
   wherein the heat dissipation plate is directly connected to the bus bar by a second cable, and
   wherein the second cable and the first insulator are connected by a third cable.

2. The component grounding system of claim 1, further comprising:
   a fourth cable disposed inside the case and used at a high voltage; and
   a second insulator configured to separate the fourth cable from the case to prevent the fourth cable from contacting an inner surface of the case.

3. The component grounding system of claim 2, wherein the second insulator is formed with a shape of "L".

4. The component grounding system of claim 3, wherein the second insulator comprises a plurality of grooves formed to be spaced apart from each other at regular intervals, and
the fourth cable is extended by passing through a portion of the plurality of grooves.

5. The component grounding system of claim 4, further comprising:
   a connection terminal disposed between the case and the DC capacitor to connect the case and the DC capacitor, the connection terminal representing a positive (+) electrode; and
   a discharge resistance disposed below the heat dissipation plate.

* * * * *